United States Patent
Park

(10) Patent No.: US 9,245,905 B2
(45) Date of Patent: Jan. 26, 2016

(54) BACK PLANE FOR FLAT PANEL DISPLAY DEVICE AND METHOD OF MANUFACTURING THE SAME

(71) Applicant: SAMSUNG DISPLAY CO., LTD., Yongin, Gyeonggi-Do (KR)

(72) Inventor: Sang Il Park, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 14/060,266

(22) Filed: Oct. 22, 2013

(65) Prior Publication Data

US 2014/0353659 A1 Dec. 4, 2014

(30) Foreign Application Priority Data

May 30, 2013 (KR) .................. 10-2013-0062105

(51) Int. Cl.
  *H01L 29/10* (2006.01)
  *H01L 29/12* (2006.01)
  *H01L 27/14* (2006.01)
  *H01L 29/04* (2006.01)
  *H01L 29/15* (2006.01)
  *H01L 31/036* (2006.01)
  *H01L 27/12* (2006.01)
  *H01L 21/00* (2006.01)
  *H01L 21/16* (2006.01)

(52) U.S. Cl.
  CPC .......... *H01L 27/1225* (2013.01); *H01L 27/124* (2013.01); *H01L 27/1248* (2013.01)

(58) Field of Classification Search
  CPC ...................................... H01L 51/50

USPC ............................ 257/43, E29.273; 438/158
See application file for complete search history.

(56) References Cited

U.S. PATENT DOCUMENTS

| 6,307,322 B1 | 10/2001 | Dawson et al. |
| 6,999,136 B2 | 2/2006 | Lee |
| 7,592,628 B2 | 9/2009 | Morimoto et al. |
| 8,436,342 B2 | 5/2013 | Park et al. |
| 2004/0079945 A1* | 4/2004 | Weaver et al. ................. 257/71 |
| 2005/0242745 A1* | 11/2005 | Jung .................... G09G 3/3233 315/169.3 |
| 2006/0152644 A1* | 7/2006 | Yi ......................... G02F 1/1368 349/42 |

(Continued)

FOREIGN PATENT DOCUMENTS

| JP | 2003-518772 | 6/2003 |
| KR | 10-2004-0026005 | 3/2004 |

(Continued)

*Primary Examiner* — Hoang-Quan Ho
(74) *Attorney, Agent, or Firm* — F. Chau & Associates, LLC

(57) ABSTRACT

A method of manufacturing a flat panel display device includes forming a first gate electrode and a second gate electrode on a substrate. The method includes forming a gate insulating layer on the substrate covering the gate electrodes. The method includes forming a first active layer and a second active layer on the gate insulating layer. The method includes forming an active insulation layer on the gate insulating layer to cover the first active layer. The active insulation layer includes a first hole and a second hole exposing portions of the first active layer. The method includes forming a first source electrode and a first drain electrode on the active insulation layer respectively filling the first hole and the second hole. The method includes forming a second source electrode and a second drain electrode to contact portions of the second active layer.

16 Claims, 7 Drawing Sheets

(56) References Cited

U.S. PATENT DOCUMENTS

| | | |
|---|---|---|
| 2010/0001284 A1* | 1/2010 | Cho et al. .................. 257/72 |
| 2010/0035376 A1* | 2/2010 | Noh et al. .................. 438/99 |
| 2011/0012116 A1 | 1/2011 | Yamazaki et al. |
| 2011/0049510 A1 | 3/2011 | Yamazaki et al. |
| 2011/0163309 A1* | 7/2011 | Choi et al. .................. 257/43 |
| 2012/0132904 A1* | 5/2012 | Yamazaki .................. 257/43 |
| 2012/0138933 A1* | 6/2012 | Kwon et al. .................. 257/59 |
| 2012/0138942 A1* | 6/2012 | Segawa ............... H01L 27/1233 257/59 |
| 2013/0320329 A1* | 12/2013 | Yeh et al. .................. 257/43 |
| 2015/0001484 A1* | 1/2015 | Choi .................. H01L 29/7869 257/40 |

FOREIGN PATENT DOCUMENTS

| | | |
|---|---|---|
| KR | 10-2008-0008987 | 1/2008 |
| KR | 10-2010-0082940 | 7/2010 |
| KR | 10-2011-0022538 | 3/2011 |

* cited by examiner

BACK PLANE FOR FLAT PANEL DISPLAY DEVICE AND METHOD OF MANUFACTURING THE SAME

CROSS-REFERENCE TO RELATED PATENT APPLICATION

This application claims priority under 35 U.S.C. §119 to Korean Patent Application No. 10-2013-0062105, filed on May 30, 2013, in the Korean Intellectual Property Office, the disclosure of which is incorporated by reference herein in its entirety.

TECHNICAL FIELD

The present invention relates to a flat panel display device, and more particularly, to a back plane for a flat panel display and a method of manufacturing the same.

DISCUSSION OF RELATED ART

Manufacturing of flat panel display devices such as, for example, organic light-emitting display devices and liquid crystal displays (LCDs) includes forming a pattern including at least one thin film transistor (TFT). The pattern may include a capacitor, and a wiring connecting the TFT to the capacitor on a substrate to drive the flat panel displays. The TFT may include a gate electrode, an active layer electrically insulated from the gate electrode by a gate insulating layer, a source electrode, and a drain electrode electrically connected to the active layer. The TFT may include a driving TFT and a switching transistor for controlling the driving TFT.

The structure of a TFT may be a top-gate structure in which a gate electrode is formed above an active layer. The structure of a TFT may alternatively be a bottom-gate structure in which the gate electrode is formed below the active layer. In the bottom-gate structure, a source electrode and a drain electrode may contact the active layer through an opening of an etch stopper that is an insulating layer formed on the active layer, or the source electrode and the drain electrode may directly contact both edges of the active layer.

To form large-size, high-resolution display devices, a switching transistor, a driving transistor, and other compensation transistors that construct a pixel circuit may be disposed within restricted pixel areas.

SUMMARY

Exemplary embodiments of the present invention provide a back plane for use in a flat panel display device and a method of manufacturing the same. The back plane can minimize an area occupied by thin film transistors (TFTs) while achieving high performance of the display device, including high resolution in a large-size display device.

According to at least one exemplary embodiment of the present invention, there is provided a back plane for use in a flat panel display device. The back plane includes a first transistor and a second transistor on a substrate. The first transistor includes a first gate electrode formed on the substrate. The first transistor includes a first gate insulating layer formed on the substrate and covering the first gate electrode. The first transistor includes a first active layer formed on the first gate insulating layer to correspond to the first gate electrode. The first transistor includes a first active insulation layer formed on the first gate insulating layer and covering the first active layer. The active insulation layer includes a first hole and a second hole exposing portions of the first active layer. The first transistor includes a first source electrode and a first drain electrode formed on the first active insulation layer respectively filling the first hole and the second hole and contacting the exposed portions of the first active layer. The second transistor includes a second gate electrode formed on the substrate. The second transistor includes a second gate insulating layer formed on the substrate and covering the second gate electrode. The second transistor includes a second active layer formed on the second gate insulating layer to correspond to the second gate electrode. The second transistor includes a second source electrode and a second drain electrode formed on the second gate insulating layer and contacting portions of the second active layer.

The first gate electrode and the second gate electrode may be formed on the same layer and of the same material. The first gate insulating layer and the second gate insulating layer may be formed on a same layer and of a same material. The first active layer and the second active layer may be formed on a same layer and of a same material. The first source electrode and the second drain electrode and the second source electrode and the second drain electrode may be formed on a same layer and of a same material.

The second transistor may include a second active insulation layer formed on the second active layer and covering a portion of the second active layer. The second source electrode and the second drain electrode may contact both sides of the second active layer, respectively.

The first active insulation layer and the second active insulation layer may be formed on a same layer and of a same material.

The back plane may include a planarization layer formed on the first active insulation layer and the second gate insulating layer and covering the first source electrode, the first drain electrode, the second source electrode, and the second drain electrode. The planarization layer may include a third hole exposing a portion of the first source electrode or a portion of the first drain electrode. The planarization layer may include a fourth hole exposing a portion of the second source electrode or a portion of the second drain electrode.

The back plane may include a first pixel electrode formed on the planarization layer and filling the third hole. The first pixel electrode may be electrically connected to one of the first source electrode or the first drain electrode by the third hole. The back plane may include a second pixel electrode that is formed on the planarization layer and filling the fourth hole. The second pixel electrode may be electrically connected to the second source electrode or the second drain electrode by the fourth hole.

The back plane may include a pixel define layer formed on the planarization layer and covering side edges of the first pixel electrode and side edges of the second pixel electrode. The pixel define layer may include a first opening exposing at least a portion of the first pixel electrode and a second opening exposing at least a portion of the second pixel electrode. The back plane may include intermediate layers formed on the first pixel electrode and the second pixel electrode exposed by the first opening and the second opening, respectively. Each of the intermediate layers may include an emissive layer. The back plane may include an opposite electrode formed on the intermediate layers and facing the first pixel electrode and the second pixel electrode.

Each of the first active layer and the second active layer may include an oxide semiconductor.

An area occupied by the first transistor on the substrate may be greater than an area occupied by the second transistor on the substrate.

The first transistor may be a driving transistor, and the second transistor may be a switching transistor.

According to exemplary embodiments of the present invention, there is provided a method of manufacturing a back plane for use in a flat panel display device. The method includes forming a first gate electrode and a second gate electrode on a substrate. The method includes forming a gate insulating layer on the substrate and covering the first gate electrode and the second gate electrode, respectively. The method includes forming a first active layer and a second active layer on the gate insulating layer, respectively, to correspond to the first electrode and the second electrode, respectively. The method includes forming an active insulation layer on the gate insulating layer and covering the first active layer. The active insulation layer includes a first hole and a second hole exposing portions of the first active layer. The method includes forming a first source electrode and a first drain electrode on the active insulation layer to respectively fill the first hole and the second hole and contact the portions of the first active layer. The method includes forming a second source electrode and a second drain electrode on the active insulation layer to contact portions of the second active layer.

The active insulation layer may be formed covering a portion of the second active layer and the second source electrode. The second source electrode and the second drain electrode may contact both sides of the second active layer, respectively.

The method may include forming a planarization layer on the active insulation layer and the gate insulating layer covering the first source electrode, the first drain electrode, the second source electrode, and the second drain electrode. The planarization layer may include a third hole exposing a portion of the first source electrode or a portion of the first drain electrode. The planarization layer may include a fourth hole exposing a portion of the second source electrode or a portion of the second drain electrode.

The method may include forming a first pixel electrode and a second pixel electrode on the planarization layer. The first pixel electrode may fill the third hole. The first pixel electrode may be electrically connected to the first source electrode or the first drain electrode by the third hole. The second pixel electrode may fill the fourth hole. The second pixel electrode may be electrically connected to one of the second source electrode and the second drain electrode by the fourth hole.

The method may include forming a pixel defining layer on the planarization layer covering side edges of the first pixel electrode and side edges of the second pixel electrode. The pixel defining layer may include a first opening exposing at least a portion of the first pixel electrode. The pixel defining layer may include a second opening exposing at least a portion of the second pixel electrode. The method may include forming intermediate layers on the first pixel electrode and the second pixel electrode exposed by the first opening and the second opening, respectively. Each of the intermediate layers may include an emissive layer. The method may include forming an opposite electrode on the intermediate layers facing the first pixel electrode and the second pixel electrode.

Each of the first active layer and the second active layer may include an oxide semiconductor.

An area occupied by the first gate electrode, the first active layer, the first source electrode, and the second drain electrode on the substrate may be greater than an area occupied by the second gate electrode, the second active layer, the second source electrode, and the second drain electrode on the substrate.

The back plane may include a driving transistor and a switching transistor. The driving transistor may include the first gate electrode, the first active layer, the first source electrode, and the second drain electrode. The switching transistor may include the second gate electrode, the second active layer, the second source electrode, and the second drain electrode.

According to exemplary embodiments of the present invention, a display device having a minimum area occupied by a thin film transistor (TFT) may be provided. The display device may provide excellent performance characteristics.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein.

DETAILED DESCRIPTION

Figure 1:
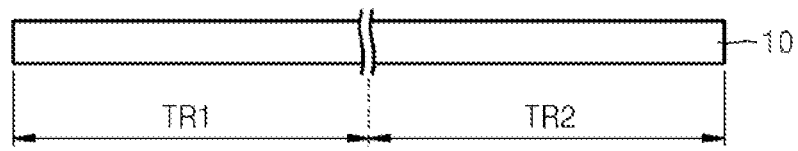
FIGS. 1 through 12 are schematic cross-sectional views illustrating a method of manufacturing a back plane for use in a flat plane display device according to exemplary embodiments of the present invention.

Exemplary embodiments of the present invention will be illustrated in the drawings and described in detail in the description. However, this description is not intended to limit the present invention to a particular mode of practice, and it is to be appreciated that the present invention encompasses all changes, equivalents, and substitutes that do not depart from the spirit and technical scope thereof. In the description of the present invention, well-known methods might not be described in detail so as not to unnecessarily obscure the essence of the present invention.

While the terms such as "first" and "second" may be used to describe various components, such components must not be limited to the above terms. The terms are used only to distinguish one component from another.

The present general inventive concept will now be described more fully with reference to the accompanying drawings, in which exemplary embodiments of the present invention are shown.

FIGS. 1 through 12 are schematic cross-sectional views illustrating a method of manufacturing a back plane for use in a flat plane display device according to exemplary embodiments of the present invention. A substrate 10 is prepared as shown in, for example, FIG. 1. The substrate 10 may be made of, for example, a transparent glass material containing silicon dioxide ($SiO_2$) as a main component. However, since the flat panel display is a top-emission display, the substrate 10 is not limited thereto. The substrate 10 may be formed of, for example, an opaque material or other various materials such as a plastic and/or a metal.

At least two thin film transistors (TFTs) including, for example, first and second transistors, as described below, are disposed on the substrate 10. The substrate 10 includes a first region TR1 on which the first transistor is formed and a second region TR2 on which the second transistor is formed.

Figure 2:
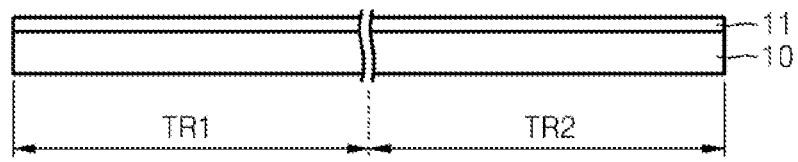

As shown in, for example, FIG. 2, an auxiliary layer 11 may be formed on the substrate 10 preventing diffusion of impurity ions and penetration of moisture or external air and to planarize a top surface of the substrate 10. The auxiliary layer may be, for example, a barrier layer, a blocking layer, and/or a buffer layer. The auxiliary layer 11 may be formed of, for example, $SiO_2$ and/or silicon nitride ($SiN_x$). The auxiliary layer 11 may be formed by using any of various deposition methods such as plasma enhanced chemical vapour deposition (PECVD), atmospheric pressure CVD (APCVD), or low pressure CVD (LPCVD). The auxiliary layer 11 may be omitted.

Figure 3:
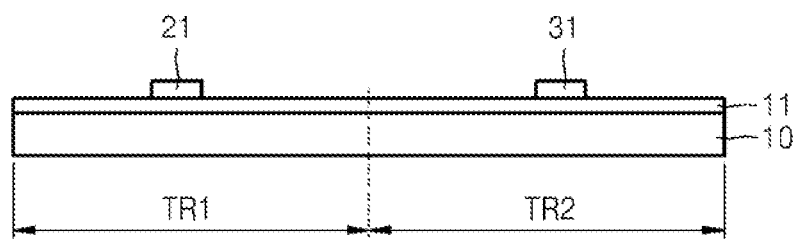

Referring to FIG. 3, a first gate electrode 21 and a second gate electrode 31 are formed on the auxiliary layer 11. The first gate electrode 21 and the second gate electrode 31 may be formed on the substrate 10. The first and second gate electrodes 21 and 31 may be disposed on the first and second regions TR1 and TR2, respectively. The first and second gate electrodes 21 and 31 may be formed of the same material and on the same layer and may be formed by using a single mask.

As shown in FIG. 3, the first and second gate electrodes 21 and 31 may each contain silver (Ag), magnesium (Mg), aluminium (Al), platinum (Pt), palladium (Pd), gold (Au), nickel (Ni), neodymium (Nd), iridium (Ir), chromium (Cr), lithium (Li), calcium (Ca), molybdenum (Mo), titanium (Ti), tungsten (W), MoW, or copper (Cu). However, the first and second gate electrodes 21 and 31 are not limited thereto, and may be made of any conductive material containing a metal.

Figure 4:
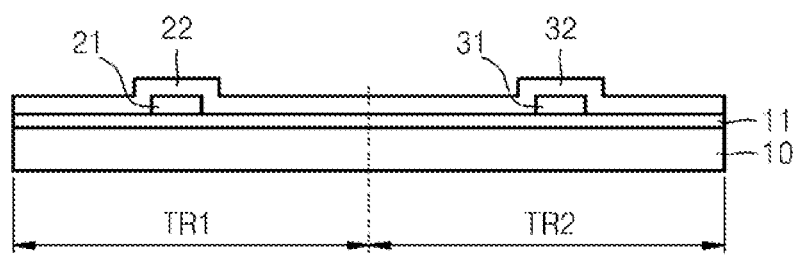

As shown in, for example, FIG. 4, first and second gate insulating layers 22 and 32 may be formed on the auxiliary layer 11 covering the first and second gate electrodes 21 and 31, respectively. The first and second gate insulating layers 22 and 32 may be formed on the substrate 10 and may cover the first and second gate electrodes 21 and 31, respectively. The first and second gate insulating layers 22 and 32 may be formed of the same material and on the same layer on the first and second regions TR1 and TR2, respectively.

The gate insulating layers 22 and 32 may be formed by depositing an inorganic insulating layer of $SiN_x$ or $SiO_x$ by using a method such as PECVD, APCVD, or LPCVD. A portion of each of the first and second gate insulating layers 22 and 32 may be interposed between a corresponding one of the gate electrodes 21 and 31 and an active layer and may be subsequently formed insulating the first and second gate electrodes 21 and 31 from the active layer.

Figure 5:
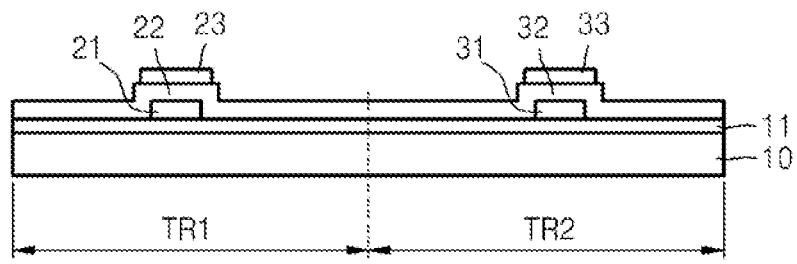

Referring to FIG. 5, a first active layer 23 and a second active layer 33 may be formed on the first and second gate insulating layers 22 and 32 to correspond to the first and second gate electrodes 21 and 31, respectively. The first and second active layers 23 and 33 may be formed of the same material and on the same layer and may be formed by using a single mask.

Although a process of forming the first and second active layers 23 and 33 is not shown in FIG. 5, the process may include depositing a semiconductor material and forming a photosensitive layer on the semiconductor material. The process may include aligning a mask (not shown) with the substrate 10, exposing the photosensitive layer by irradiating it with light of a predetermined wavelength, and etching the semiconductor material except for the first and second active layers 23 and 33 by using the photosensitive layer patterned by exposure to the light as an etch stopper to thereby form the first and second active layers 23 and 33. However, the formation process is described as an example and the invention is not limited thereto.

The first and second active layers 23 and 33 may be formed of polycrystalline silicon. However, the materials used to form the first and second active layers 23 and 33 are not limited thereto. The first and second active layers 23 and 33 may be made of an oxide semiconductor. The oxide semiconductor may include oxide of a Group 12, 13, or 14 metal elements such as zinc (Zn), indium (In), gallium (Ga), tin (Sn), cadmium (Cd), germanium (Ge), hafnium (Hf), or combinations thereof, for example.

Figure 6:
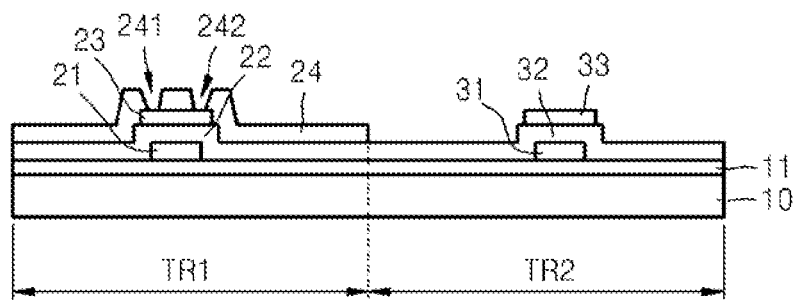

After forming the first and second active layers 23 and 33 on the first and second gate insulating layers 22 and 32, respectively, referring to FIG. 6, an active insulation layer 24 may be formed on the first gate insulating layer 22 and may cover the first active layer 23. The active insulation layer 24 may include first and second holes 241 and 242. The first and second holes 241 and 242 may expose portions of the first active layer 23.

The active insulation layer 24 may be deposited on the resultant structure of FIG. 5, and a portion of the active insulation layer 24 may be etched, thereby forming first and second holes 241 and 242 that expose a portion of the first active layer 23. The first and second holes 241 and 242 may be formed by performing various methods such as, for example, wet etching and dry etching as long as the underlying first active layer 23 is not etched. The active insulation layer 24 may protect the first active layer 23.

According to a exemplary embodiment, the active insulation layer 24 need not be formed on the second region TR2. After depositing the active insulation layer 24 on the resultant structure of FIG. 5, a portion of the active insulation layer 24 on the second region TR2 may be etched. The etching may be performed by various methods such as, for example, wet etching and dry etching techniques as long as a structure on the second region TR2 is not etched. A mask may be used so that the active insulation layer 24 may be deposited on the first region TR1 and not on the second region TR2.

Figure 7:
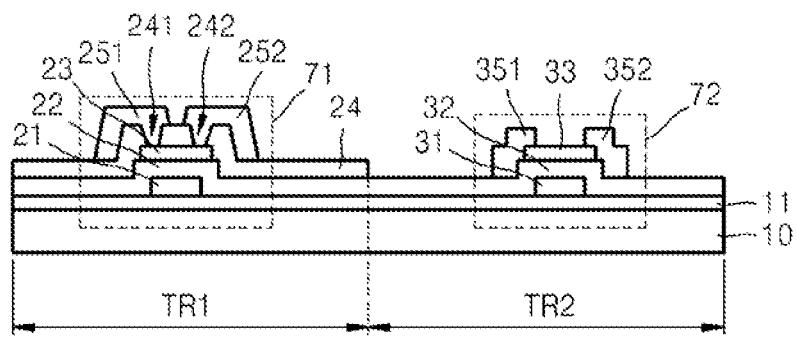

As shown in, for example, FIG. 7, a first source electrode 251 and a first drain electrode 252 may be formed on the first region TR1. A second source electrode 351 and a second drain electrode 352 may be formed on the second region TR2. The first source and drain electrodes 251 and 252 may be formed on the active insulation layer 24 filling the first and second holes 241 and 242, respectively. The first source and drain electrodes 251 and 252 may contact portions of the first active layer 23. The second source and drain electrodes 351 and 352 may be formed contacting portions of the second active layer 33. Although the first source and drain electrodes 251 and 252 are embedded in the first and second holes 241 and 242 contacting the first active layer 23, they are separated from each other. Similarly, the second source and drain electrodes 351 and 352 may contact portions of the second active layer 33, but are separated from each other.

The first source and drain electrodes 251 and 252 and the second source and drain electrodes 351 and 352 may be formed of the same material and on the same layer. The first source and drain electrodes 251 and 252 and the second source and drain electrodes 351 and 352 may be formed by using the same mask. For example, in forming the first source and drain electrodes 251 and 252 and the second source and drain electrodes 351 and 352, a metal layer may be stacked on the resultant structure of FIG. 6 and selectively etched. The etching may be performed by various methods such as wet etching or dry etching techniques. The metal layer may include Ag, Mg, Al, Pt, Pd, Au, Ni, Nd, Ir, Cr, Li, Ca, Mo, Ti, W, MoW, or Cu.

Referring to FIG. 7, for example, first and second transistors 71 and 72 may be formed on the first and second regions TR1 and TR2, respectively. The first and second transistors 71 and 72 may have different structures from each other.

An area occupied by the first transistor 71 on the substrate 10 may be greater than an area occupied by the second transistor 72 on the substrate 10, as will be described below with reference to FIGS. 15A through 15C. In this case, the first transistor 71 may include the first gate electrode 21, the first active layer 23, and the first source and drain electrodes 251 and 252. The second transistor 72 may include the second gate electrode 31, the second active layer 33, and the second source and drain electrodes 351 and 352.

Figure 8:
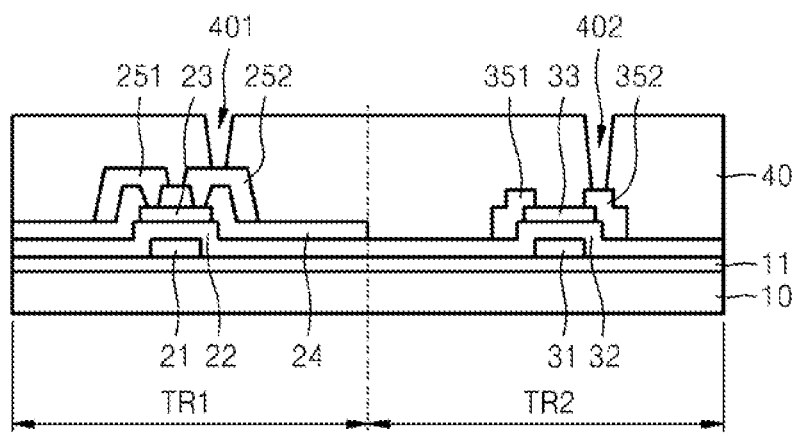

Referring to FIG. 8, for example, a planarization layer 40 may be formed on the resultant structure of FIG. 7. The planarization layer 40 may be formed on the active insulation layer 24 and the second gate insulating layer 32 covering the first source and drain electrodes 251 and 252 and the second source and drain electrodes 351 and 352, respectively. The planarization layer 40 may include a third hole 401 exposing a portion of the first source or drain electrode 251 or 252 and a fourth hole 402 exposing a portion of the second source or drain electrode 351 or 352. FIG. 8 illustrates an exemplary embodiment of the present invention in which a portion of the first drain electrode 252 and a portion of the second drain electrode 352 are exposed by the third and fourth holes 402, respectively.

The planarization layer 40 may be formed by a patterning process using a mask. The third and fourth holes 401 and 402 may be formed in the planarization layer 40 electrically connecting the first and second transistors 71 and 72 with pixel electrodes that will be described below. While the third and fourth holes 401 and 402 may be formed exposing the first and second drain electrodes 252 and 352, respectively, the present invention is not limited thereto. The third and fourth holes 401 and 402 may also have a shape as illustrated, for example, in FIG. 8 or various other shapes.

The planarization layer 40 may be formed of at least one organic insulating material such as polyimide, polyamide (PA), acryl resin, benzocyclobutene (BCB) or phenolic resin by using a method such as spin coating. Instead of the above-described organic insulating material, the planarization layer 40 may be formed of an inorganic insulating material such as $SiO_2$, $SiN_x$, aluminium oxide ($Al_2O_3$), copper oxide ($CuO_x$), terbium oxide ($Tb_4O_7$), yttrium oxide ($Y_2O_3$), niobium oxide ($Nb_2O_5$), or praseodymium oxide ($Pr_2O_3$). The planarization layer 40 may have a multi-layered structure including, for example, organic and inorganic insulating materials alternately stacked therein.

The planarization layer 40 may be formed to a desired thickness. For example, the planarization layer 40 may be thicker than the first and second gate insulating layers 22 and 32 or the active insulation layer 24 and may planarize an upper surface of the structure on which pixel electrodes as described below are to be formed or to function as a passivation layer for protecting the first source and drain electrodes 251 and 252 and the second source and drain electrodes 351 and 352.

Figure 9:
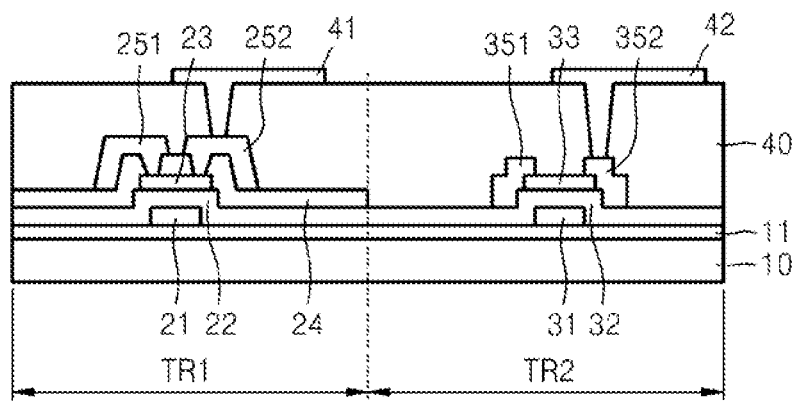

As shown in, for example, FIG. 9, first and second pixel electrodes 41 and 42 may be formed on the resultant structure of FIG. 8. The first pixel electrode 41 may be formed filling the third hole 401 and the first pixel electrode may be electrically connected to the first source or drain electrodes 251 and 252 by the third hole 401. The second pixel electrode 42 may be formed filling the fourth hole 402 and may be electrically connected to one of the second source and drain electrodes 351 and 352 by the fourth hole 402.

The first and second pixel electrodes 41 and 42 may be formed by a patterning process using a mask and of different materials. The materials may depend on the light emission type of organic light-emitting displays. For example, in a bottom-emission type display where an image is displayed toward the substrate 10 or in a dual-emission display where an image is displayed both toward and in a direction away from a top surface of the substrate 10, the first and second pixel electrodes 41 and 42 may be formed of a transparent metal oxide. Each of the first and second pixel electrodes 41 and 42 may include indium tin oxide (ITO), indium zinc oxide (IZO), zinc oxide (ZnO), and/or indium oxide ($In_2O_3$). In these types of displays, the first and second pixel electrodes 41 and 42 may be designed not to overlap the first and second regions TR1 and TR2, respectively.

In a top-emission type display where an image is displayed in a direction away from a top surface of the substrate 10, each of the first and second pixel electrodes 41 and 42 may include a reflective electrode made of a light-reflecting material. In this type of display, the first and second pixel electrodes 41 and 42 may overlap the first and second regions TR1 and TR2, respectively.

Figure 10:
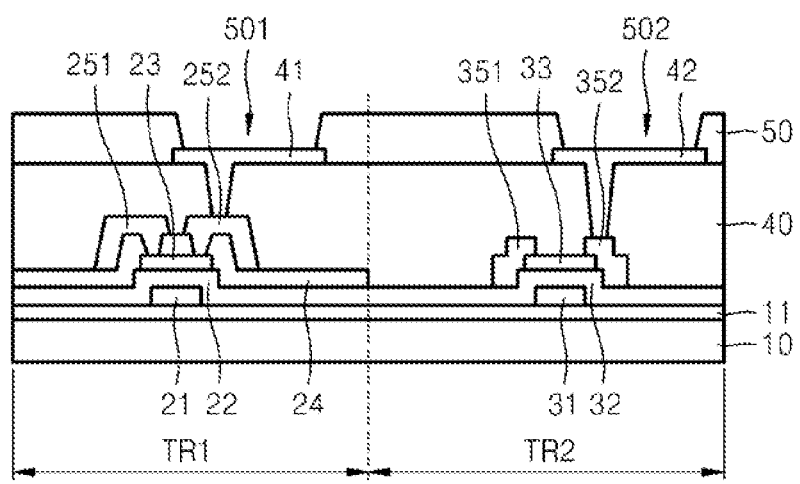

Referring to FIG. 10, a pixel define layer (PDL) 50 may be formed on the planarization layer 40 covering side edges of the first and second pixel electrodes 41 and 42. The PDL 50 may include a first opening 501 exposing at least a portion of the first pixel electrode 41 and a second opening 502 exposing at least a portion of the second pixel electrode 42. The PDL 50 may include an organic material such as polyimide-based polymer, acryl-based polymer, or olefin-based polymer. The PDL 50 may define a region where an intermediate layer in an organic light-emitting element as described below is to be formed.

Figure 11:
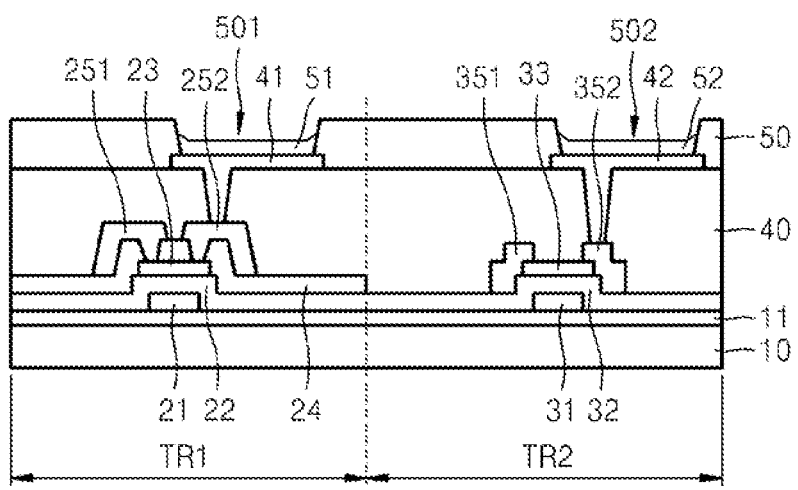

Referring to FIG. 11, intermediate layers 51 and 52 may be formed on the first and second pixel electrodes 41 and 42 exposed by the first and second openings 501 and 502, respectively. Each of the intermediate layers 51 and 52 may include an emissive layer (EML).

Each of the intermediate layers 51 and 52 may have a single- or multi-layered structure formed by stacking an EML and at least one function layer including, for example, a hole transport layer (HTL), a hole injection layer (HIL), an electron transport layer (ETL), and an electron injection layer (EIL). Each of the intermediate layers 51 and 52 may be formed of a low- or high-molecular organic material.

When the intermediate layers 51 and 52 are formed of low-molecular organic materials, the intermediate layers 51 and 52 each may be formed by stacking the HTL and the HIL on a surface of the EML toward the first and second pixel electrodes 41 and 42 and the ETL and the EIL on a surface of the EML toward an opposite electrode 60, as described below with reference to, for example, FIG. 12. Various other layers may also be stacked. Examples of the low-molecular organic materials may include copper phthalocyanine (CuPc), N,N-di(naphthalene-1-yl)-N,N-diphenyl-benzidine (NPB), tris-8-hydroxyquinoline aluminum (Alq3), and/or various other materials.

When the intermediate layers 51 and 52 are formed of high molecular organic materials, the intermediate layers 51 and 52 each may include only an HTL on the surface of the EML toward the first and second pixel electrodes 41 and 42. The HTL may be formed of poly-(2,4)-ethylene-dihydroxy thiophene (PEDOT), polyaniline (PANI), or the like, on the first and second pixel electrodes 51 and 52 by inkjet printing or spin coating. Examples of the high-molecular organic materials may include polyphenylenevinylene (PPV)-based polyfluorene-based organic materials. A color pattern may be formed by using a general method such as inkjet printing, spin coating, or a thermal transfer method using a laser.

The EML may be formed in each sub-pixel emitting red, green, or blue light, and sub-pixels may be grouped into a single unit pixel.

Figure 12:
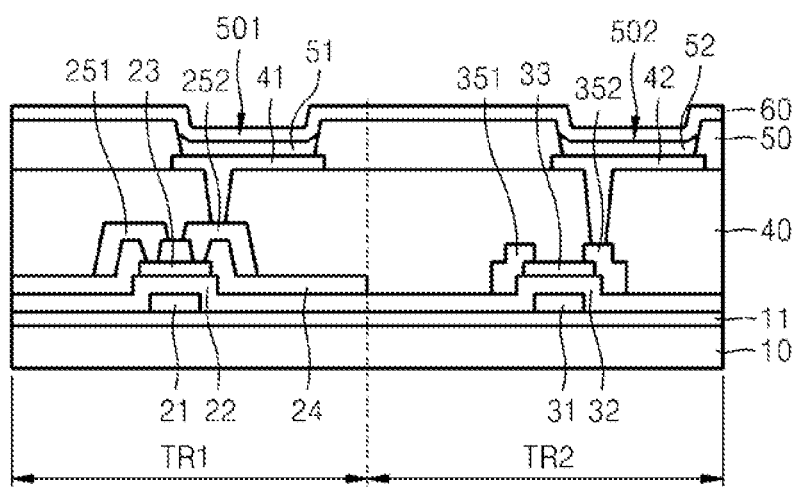

Referring to FIG. 12, an opposite electrode 60 may be formed on the intermediate layers 51 and 52 facing the first and second pixel electrodes 41 and 42.

The opposite electrode 60 may be deposited over the substrate 10 and may serve as a common electrode. In the flat panel display device, according to the exemplary embodiments of the present invention, the first and second pixel electrodes 41 and 42 may each function as an anode while the opposite electrode 60 may function as a cathode. In exemplary embodiments of the present invention, the first and second pixel electrodes 41 and 42 may each be used as a cathode, and the opposite electrode 60 may be used as an anode.

While the intermediate layers 51 and 52 may be formed within the first and second openings 501 and 502, respectively, and each pixel may include a separate emissive material, the present invention is not limited thereto. The intermediate layers 51 and 52 may be commonly formed on the entire surface of the PDL 50 regardless of the position of a pixel. In this case, the intermediate layers 51 and 52 may include EMLs vertically stacked thereon or combined, each EML having an emissive material emitting red, green, or blue light. The EMLs may emit white light, and in this case, the flat panel display device may include a color conversion layer or a color filter converting the emitted white light into predetermined colors.

When the flat panel display is a top emission type that displays an image in a direction opposite to the substrate 10, the opposite electrode 60 may be a transparent electrode, and the first and second pixel electrodes 41 and 42 may be reflective electrodes. In this case, a reflective electrode may be formed by thinly depositing a low work function metal such as, for example, Ag, Mg, Al, Pt, Pd, Au, Ni, Nd, Ir, Cr, Li, Ca, or lithium fluoride (LiF), or a combination thereof. In the back plane for use in a flat panel display according to exemplary embodiments of the present invention, the opposite electrode 60 may be configured to transmit light.

Figure 13:
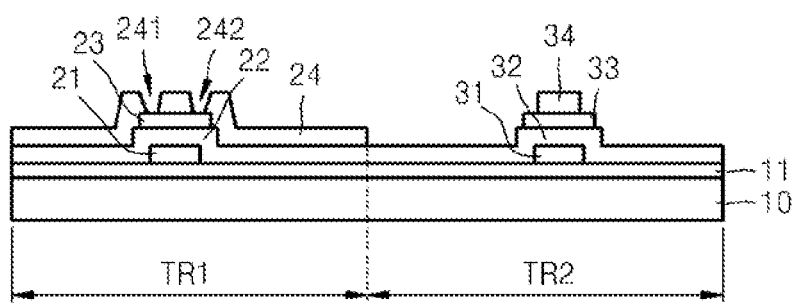
FIGS. 13 and 14 are schematic cross-sectional views illustrating a part of a method of manufacturing a back plane for use in a flat panel display device according to at least one exemplary embodiment of the present invention.
Figure 14:
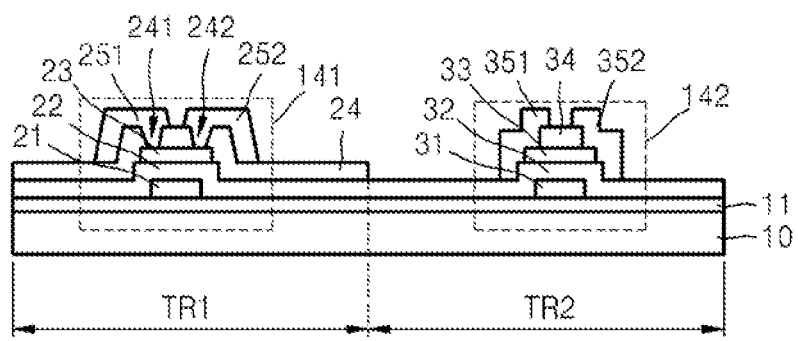

FIGS. 13 and 14 are schematic cross-sectional views illustrating a part of a method of manufacturing a back plane for use in a flat panel display device according to at least one exemplary embodiment of the present invention.

Referring to FIG. 13, an active insulation layer 24 may be formed on the resultant structure of FIG. 5 in a manner different than that used for the active insulation layer 24 formed thereon as illustrated in FIG. 6.

According to at least one exemplary embodiment of the present invention, an active insulation layer 34 may be formed on the resultant structure of FIG. 6 covering a portion of the second active layer 33. The active insulation layer 34 on the second region TR2 may be formed of the same material as that used to form the active insulation layer 24 on the first region TR1. The active insulation layer 34 on the second region TR2 may be formed on the same layer as the layer where the active insulation layer 24 is formed. The active insulation layer 34 on the second region TR2 may be formed by using a same mask as that used to form the active insulation layer 24.

As shown in FIG. 14, for example, first source and drain electrodes 251 and 252 and second source and drain electrodes 351 and 352 may be formed on the resultant structure of FIG. 13. The first source and drain electrodes 251 and 252 may be formed in the same way as in the exemplary embodiment of the present invention shown in, for example, FIG. 7.

According to at least one exemplary embodiment of the present invention, as shown in, for example, FIG. 14, the second source and drain electrodes 351 and 352 may be formed covering portions of the active insulation layer 34 on the second active layer 33. The second source and drain electrodes 351 and 352 may contact both sides of the second active layer 33 that are not covered by the active insulation layer 34. Referring to FIG. 14, a third transistor 141 and a fourth transistor 142 may be formed on the first and second regions TR1 and TR2, respectively, and may have different structures from each other.

In this regard, an area occupied by the third transistor 141 on the substrate 10 may be greater than an area occupied by the second transistor 142 thereon, as will be described below with reference to FIGS. 15A through 15C. The third transistor 141 may include a first gate electrode 21, a first active layer 23, and the first source and drain electrodes 251 and 252. The second transistor 142 may include a second gate electrode 31, the second active layer 33, and the second source and drain electrodes 351 and 352.

Although not shown in the drawings, a structure including, for example, the planarization layer 40, the first and second pixel electrodes 41 and 42, the PDL 50, the intermediate layers 51 and 52, and the opposite electrode 60 may be formed on the resultant structure of FIG. 14 in the same way as described with reference to FIGS. 8 through 12.

Referring to FIGS. 7 and 14, although the first and third transistors 71 and 141 may have the same structure, the second and fourth transistors 72 and 142 may have different structures from each other. Hereinafter, the structures of the first and third transistors 71 and 141, the second transistor 72, and the fourth transistor 142 are referred to as a first type, a second type, and a third type, respectively.

The structures of three types of transistors will now be described with reference to FIGS. 15A through 15C.

Figure 15A:
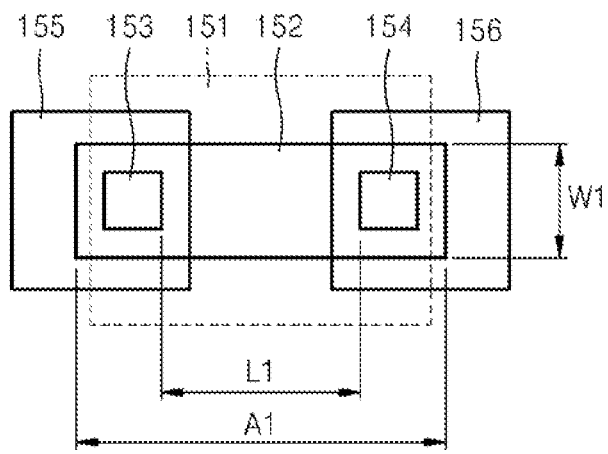
FIGS. 15A through 15C are schematic diagrams illustrating structures of first through third types of transistors.

FIG. 15A schematically illustrates a first type of transistor. The first type of transistor includes a gate electrode 151, an active layer 152, a source electrode 155, and a drain electrode 156. The source and drain electrodes 155 and 156 may contact the active layer 152 through contact holes 153 and 154, respectively. The first type of transistor may include an active insulation layer that is formed covering a portion of an upper surface of and both side edges of active layer 152. The first type transistor may include the contact holes 153 and 154. Referring to FIG. 15A, a width and a length of a channel region between the source and drain electrodes 155 and 156 are indicated by W1 and L1, respectively, and an overall size of the transistor is indicated by A1.

When stability of the transistor and a process design are considered, the structure of the first type of transistor may have a limitation on the reduction of the width W1 and the length L1 of the channel region. Thus, the overall size of the transistor can only be reduced to a limited degree. However, the first type of transistor exhibits stable characteristics and small characteristic dispersion.

Figure 15B:
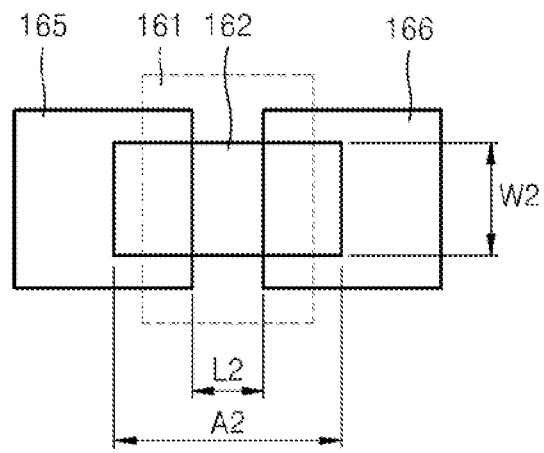

FIG. 15B schematically illustrates a second type of transistor. The second type of transistor includes a gate electrode 161, an active layer 162, a source electrode 165, and a drain electrode 166. The source and drain electrodes 165 and 166 may directly contact both side edges of the active layer 162 without passing through contact holes. Referring to FIG. 15B, a width and a length of a channel region between the source and drain electrodes 165 and 166 are indicated by W2 and L2, respectively, and an overall size of the transistor is indicated by A2.

The second type of transistor has a small size and may be fabricated by using a reduced number of mask processes.

However, the second type of transistor has unstable characteristics and large characteristic dispersion compared to the first type of transistor.

Figure 15C:
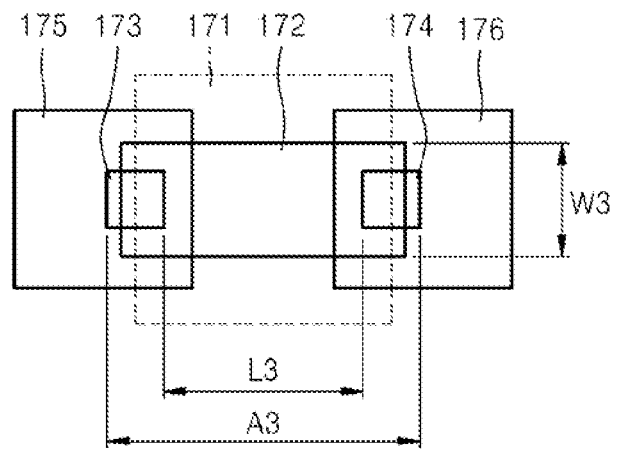

FIG. 15C schematically illustrates a third type of transistor. The third type of transistor includes a gate electrode 171, an active layer 172, a source electrode 175, and a drain electrode 176. The source and drain electrodes 175 and 176 may contact both side edges of the active layer 172 through contact holes 173 and 174. The third type of transistor may include an active insulation layer formed on a portion of an upper surface of the active layer 172. Referring to FIG. 15C, a width and a length of a channel region between the source and drain electrodes 175 and 176 are indicated by W3 and L3, respectively, and an overall size of the transistor is indicated by A3.

The third type of transistor has the width W3 and the length L3 that are slightly different from the width W1 and length L1 of the first type of transistor, but its overall size A3 is smaller than the overall size A1 of the first type of transistor. Although the third type of transistor has a large limitation on the reduction of the width W3, the length L3, and the overall size A3, the third type of transistor still shows stable characteristics and small characteristic dispersion, compared to the second type of transistor.

As evident from FIGS. 15A through 15C, when comparing the first through third types of transistors with one another, the first type of transistor has the largest overall size A1 while the second type of transistor has the smallest overall size A2. However, in terms of stability, the first type of transistor exhibits the most stable characteristics while the second type of transistor exhibits the most unstable characteristics. There is a trade-off relationship between transistor stability and the overall transistor size.

By using appropriate combinations of the first through third types of transistors according to their functions in a back plane for use in a flat panel display, areas occupied by the transistors in the back plane may be minimized, and appropriate levels of stability and reliability of the transistors may be achieved.

For example, the first type of transistor may be used as a transistor such as a driving transistor that may directly affect the brightness of an organic light-emitting element. The second or third type of transistor may be used as a transistor such as a switching transistor that performs on/off switching thereby reducing an area occupied by the transistor. Thus, the area occupied by a plurality of transistors in a pixel may be reduced. This is illustrated by way of an example of a combination of the first through third types of transistors. The first through third type of transistors may be combined in various other ways.

According to exemplary embodiments of the present invention, since the first and second pixel electrodes 41 and 42, the intermediate layers 51 and 52, and the opposite electrode 60 form an organic electroluminescence (EL) element, a back plane for use in a flat panel display device manufactured by a method according to exemplary embodiments of the present invention may be used as a back plane for use in an organic light-emitting display device. However, the present invention is not limited thereto. For example, if a liquid crystal is interposed between the first and second pixel electrodes 41 and 42 and the opposite electrode 60, a back plane for use in a flat panel display device manufactured by a method according to exemplary embodiments of the present invention may be used as a back plane for use in a liquid crystal display (LCD).

During a mask process for forming the above-described back plane for use in a flat panel display device, stacked layers may be removed by dry etching or wet etching. Although only one or two transistors are illustrated in the drawings for convenience of explanation, the present invention is not limited thereto. As long as the number of mask processes is not increased, the back plane may include a plurality of transistors and a plurality of capacitors.

While the present invention has been particularly shown and described with reference to exemplary embodiments thereof, it will be understood by those of ordinary skill in the art that various changes in form and details may be made therein without departing from the spirit and scope of the present invention.

What is claimed is:

1. A back plane, comprising a substrate;
a first transistor and a second transistor disposed on the substrate,
wherein the first transistor is a driving transistor comprising:
a first gate electrode formed on the substrate;
a first gate insulating layer formed on the substrate covering the first gate electrode;
a first active layer formed on the first gate insulating layer, the first active layer corresponding to the first gate electrode;
a first active insulation layer formed on the first gate insulating layer covering the first active layer, the first active insulation layer including a first hole and a second hole each exposing portions of the first active layer; and
a first source electrode and a first drain electrode formed on the first active insulation layer respectively filling the first hole and the second hole and contacting the exposed portions of the first active layer, and
wherein the second transistor is a switching transistor comprising:
a second gate electrode formed on the substrate;
a second gate insulating layer formed on the substrate covering the second gate electrode;
a second active layer formed on the second gate insulating layer, the second active layer corresponding to the second gate electrode;
a second active insulation layer disposed entirely on a central portion of the second active layer, wherein the second active insulation layer is narrower in length than the second active layer; and
a second source electrode and a second drain electrode formed on the second gate insulating layer contacting portions of the second active layer,
wherein the first transistor and the second transistor have different structures from each other, and an overall size of the second transistor is smaller than an overall size of the first transistor.

2. The back plane of claim 1, wherein the first gate electrode and the second gate electrode are formed on a same layer and of a same material,
wherein the first gate insulating layer and the second gate insulating layer are formed on a same layer and of a same material,
wherein the first active layer and the second active layer are formed on a same layer and of a same material,
wherein the first source electrode and the first drain electrode are formed on a same layer and of a same material, and
wherein the second source electrode and the second drain electrode are formed on a same layer and of a same material.

3. The back plane of claim 1, wherein the second source electrode and the second drain electrode contact two sides of the second active layer, respectively.

4. The back plane of claim 3, wherein the first active insulation layer and the second active insulation layer are formed on a same layer and of a same material.

5. The back plane of claim 1, further comprising a planarization layer formed on the first active insulation layer and the second gate insulating layer covering the first source electrode, the first drain electrode, the second source electrode, and the second drain electrode, and
wherein the planarization layer comprises a third hole exposing a portion of the first source electrode or a portion of the first drain electrode and a fourth hole exposing a portion of the second source electrode or a portion of the second drain electrode.

6. The back plane of claim 5, wherein the first pixel electrode is formed on the planarization layer filling the third hole, wherein the first pixel electrode is electrically connected to the first source electrode or the first drain electrode by the third hole,
wherein the second pixel electrode is formed on the planarization layer to fill the fourth hole, and wherein the second pixel electrode is electrically connected to one of the second source electrode and the second drain electrode by the fourth hole.

7. The back plane of claim 6, further comprising:
a pixel define layer formed on the planarization layer covering side edges of the first pixel electrode and side edges of the second pixel electrode, the pixel define layer comprising a first opening exposing at least a portion of the first pixel electrode and a second opening exposing at least a portion of the second pixel electrode;
one or more intermediate layers formed on the first pixel electrode and the second pixel electrode exposed by the first opening and the second opening, respectively, wherein each of the intermediate layers includes an emissive layer; and
an opposite electrode formed on the intermediate layers facing the first pixel electrode and the second pixel electrode.

8. The back plane of claim 1, wherein each of the first active layer and the second active layer comprises an oxide semiconductor.

9. A method of manufacturing a back plane, the method comprising:
forming a first transistor, wherein the first transistor is a driving transistor, and wherein forming the first transistor comprises:
forming a first gate electrode on a substrate;
forming a first gate insulating layer on the substrate covering the first gate electrode;
forming a first active layer on the first gate insulating layer;
forming a first active insulation layer on the first gate insulating layer covering the first active layer, wherein the first active insulation layer comprises a first hole and a second hole exposing portions of the first active layer;
forming a first source electrode and a first drain electrode on the first active insulation layer respectively filling the first hole and the second hole and contacting the portions of the first active layer;
forming a second transistor, wherein the second transistor is a switching transistor, and wherein forming the second transistor comprises:
forming a second gate electrode on the substrate;
forming a second gate insulating layer on the substrate covering the second gate electrode;
forming a second active layer on the second gate insulating layer;
forming a second active insulation layer disposed entirely on a central portion of the second active layer, wherein the second active insulation layer is narrower in length than the second active layer; and
forming a second source electrode and a second drain electrode on the second gate insulating layer contacting portions of the second active layer,
wherein the first transistor and the second transistor have different structures from each other, and an overall size of the second transistor is smaller than an overall size of the first transistor.

10. The method of claim 9, wherein the second source electrode and the second drain electrode contact two sides of the second active layer, respectively.

11. The method of claim 9, further comprising forming a planarization layer on the active insulation layers and the gate insulating layers covering the first source electrode, the first drain electrode, the second source electrode, and the second drain electrode, and
wherein the planarization layer comprises a third hole exposing a portion of the first source electrode or a portion of the first drain electrode, and a fourth hole exposing a portion of the second source electrode or a portion of the second drain electrode.

12. The method of claim 11, wherein the first pixel electrode and the second pixel electrode are formed on the planarization layer, wherein the first pixel electrode fills the third hole and is electrically connected to the first source electrode or the first drain electrode by the third hole, and the second pixel electrode fills the fourth hole and is electrically connected to the second source electrode or the second drain electrode by the fourth hole.

13. The method of claim 12, further comprising:
forming a pixel defining layer on the planarization layer covering side edges of the first pixel electrode and side edges of the second pixel electrode, wherein the pixel defining layer comprises a first opening exposing at least a portion of the first pixel electrode and a second opening exposing at least a portion of the second pixel electrode;
forming intermediate layers on the first pixel electrode and the second pixel electrode exposed by the first opening and the second opening, respectively, wherein each of the intermediate layers includes an emissive layer; and
forming an opposite electrode on the intermediate layers facing the first pixel electrode and the second pixel electrode.

14. The method of claim 9, wherein each of the first active layer and the second active layer comprises an oxide semiconductor.

15. The method of claim 9, further comprising forming a planarization layer on the active insulation layers and the gate insulating layers covering the first source electrode, the first drain electrode, the second source electrode, and the second drain electrode, and
wherein the planarization layer is formed of polyimide (PI), polyamide (PA), acryl resin, benzocyclobutene (BCB), or phenolic resin.

16. The method of claim 9, further comprising forming a planarization layer on the active insulation layers and the gate insulating layers covering the first source electrode, the first drain electrode, the second source electrode, and the second drain electrode, and
wherein the planarization layer is formed of at least one of silicon dioxide ($SiO_2$), silicon nitride ($SiN_x$), aluminium oxide ($Al_2O_3$), copper oxide ($CuO_x$), terbium oxide ($Tb_4O_7$), yttrium oxide ($Y_2O_3$), niobium oxide ($Nb_2O_5$), and praseodymium oxide ($Pr_2O_3$).

* * * * *